(12) United States Patent
Landraud et al.

(10) Patent No.: US 7,352,384 B2
(45) Date of Patent: Apr. 1, 2008

(54) METHOD FOR PRINTING A NEAR FIELD PHOTOINDUCED STABLE STRUCTURE, AND OPTICAL FIBRE TIP FOR IMPLEMENTING SAME

(75) Inventors: Nathalie Landraud, Lyons (FR); Jacques Peretti, Paris (FR); Frédéric Chaput, Massy (FR); Georges Lampel, Paris (FR); Jean-Pierre Boilot, Meudon la Foret (FR); Khalid Lahlil, Orsay (FR); Viatcheslav Safarov, Arcueil (FR)

(73) Assignee: Essilor International Compagnie Generale d'Optique, Charenton Cedex (FR)

( * ) Notice: Subject to any disclaimer, the term of this patent is extended or adjusted under 35 U.S.C. 154(b) by 341 days.

(21) Appl. No.: 10/485,038

(22) PCT Filed: Jul. 26, 2002

(86) PCT No.: PCT/FR02/02698

§ 371 (c)(1),
(2), (4) Date: Jan. 26, 2004

(87) PCT Pub. No.: WO03/010604

PCT Pub. Date: Feb. 6, 2003

(65) Prior Publication Data

US 2004/0214115 A1      Oct. 28, 2004

(30) Foreign Application Priority Data

Jul. 26, 2001 (FR) .................................. 01 10019

(51) Int. Cl.
*B41J 2/435* (2006.01)
*B23K 26/00* (2006.01)

(52) U.S. Cl. ................................... 347/224; 219/121.6

(58) Field of Classification Search ........ 347/224–225, 347/241, 256; 355/53; 369/112.27; 430/311, 430/321; 250/306, 492.2; 385/31; 219/121.6–121.69
See application file for complete search history.

(56) References Cited

U.S. PATENT DOCUMENTS 4,590,492 A * 5/1986 Meier .......................... 347/242

(Continued)

FOREIGN PATENT DOCUMENTS

EP          0419369            3/1991

(Continued)

OTHER PUBLICATIONS

Bertrand, Philippe, "Near filed optical microscopy," English abstract of thesis dated Jan. 22, 1999.

(Continued)

*Primary Examiner*—Hai Pham
(74) *Attorney, Agent, or Firm*—Fulbright & Jaworski L.L.P.

(57) ABSTRACT

The invention generally concerns a method involving emitting polarization light waves through an aperture with a dimension of maximum size lower than or equal to 100 nm, wherein the aperture is circumferentially bound by an opaque area that prevents the light waves from being propagated outside the aperture during use, and wherein the emitted polarization light waves (1) contact a material layer comprising a photosensitive compound whose surface is located at a distance lower than 100 nm from said aperture, and (2) induce a topographic modification of the material layer. In this manner, a stable structure is printed in relief in the material layer without requiring any additional development step. The invention is applicable, in certain embodiments, to ophthalmic optics.

36 Claims, 3 Drawing Sheets

U.S. PATENT DOCUMENTS

| | | | | |
|---|---|---|---|---|
| 4,771,415 | A | * | 9/1988 | Taki ..................... 369/112.27 |
| 4,880,496 | A | | 11/1989 | Nebenzahl et al. ......... 156/643 |
| 5,384,464 | A | * | 1/1995 | De Fornel et al. ....... 250/492.2 |
| 5,608,831 | A | | 3/1997 | Pan ............................. 385/85 |
| 5,729,331 | A | * | 3/1998 | Tanaka et al. ................. 355/53 |
| 5,932,397 | A | * | 8/1999 | Mustacich ................... 430/321 |
| 6,104,030 | A | * | 8/2000 | Chiba et al. ................. 250/306 |
| 6,236,783 | B1 | * | 5/2001 | Mononobe et al. ........... 385/43 |
| 6,437,852 | B1 | * | 8/2002 | Sugita .......................... 355/53 |
| 6,899,999 | B2 | * | 5/2005 | Hiraoka et al. ............. 430/311 |
| 2002/0154859 | A1 | * | 10/2002 | Kuroda et al. ................ 385/31 |

FOREIGN PATENT DOCUMENTS

| | | |
|---|---|---|
| EP | 0880078 | 11/1998 |
| JP | 8248641 | 9/1996 |
| JP | 08248641 A * | 9/1996 |

OTHER PUBLICATIONS

Betzig et al., "Near-field magneto-optics and high density data storage," *Appl. Phys. Letters*, 61(2):142-144, 1992.

Chaput et al., "Photochromic sol-gel films containing dithienylethene and azobenzene derivatives. From the design of optical components to the optical data storage," *Mol. Cryst. Liq. Cryst.*, 344:77-82, 2000.

* cited by examiner

METHOD FOR PRINTING A NEAR FIELD PHOTOINDUCED STABLE STRUCTURE, AND OPTICAL FIBRE TIP FOR IMPLEMENTING SAME

This application is a national phase application under 35 U.S.C. § 371 of PCT Application No. PCT/FR02/02698 filed 26 Jul. 2002, which claims priority to French Application No. 01/10019 filed 26 Jul. 2001, the contents of which are incorporated herein by reference in their entirety.

This invention relates to a method for printing a stable structure in relief in a material comprising a photosensitive compound, through radiating said material from one or more localised light sources with a size lower than the wavelength of said radiation.

The increasing development of the computer processing powers and the spread of the information exchange make necessary to get available means allowing for the storage density to be increased on information media.

Generally, the information on the usual media are printed in the form of repeating patterns obtained through index change or through local topographic modification.

One of the major problems lies in increasing the printing resolution.

It is already known to achieve surface topographic modifications, for example in hybrid sol/gel materials containing azobenzene groups.

In the thesis by Philippe Bertrand entitled <<Near field optical microscopy. An optical response at the submicronic scale>> dated 22nd Jan. 1999, available in the university library of the Ecole Polytechnique, 91128 Palaiseau, France, an experiment is disclosed where a topographic structure has been photoinduced in a sol/gel layer, using as a light source an optical fibre having the tip obtained through heat sequential stretching and non attacked in the acid.

The printed structure consists of letters in turn consisting in plots of 15 nm height and 40 nm×40 nm side.

A similar result is disclosed in an article entitled <<Photochromic sol-gel films containing dithienylethene and azobenzene derivates: from the optical component design to the optical data storing>>. Mol. Cryst. Liq. Cryst., 2000, vol. 344, pp 77-82.

Generally, both those documents point out that it seems excluded that such a topographic modification originates from a simple thermal effect, as it could be observed from other prior art documents (<<Near-field magnetooptics and high density data storage>>), E. Betzig et al.; Appl. Phys. Letters, vol. 61 (2), pp. 142-144 (1992), in so far as the light polarisation plays a part on distorting the layer surface, and not only the light source intensity.

The first two above-mentioned documents disclose preliminary results and the method being briefly disclosed has the disadvantage of lacking reproducibility.

Indeed, for a readable inscription, the method should allow, on the one hand, to perfectly control the geometry of the written patterns, on the other hand, to avoid any alteration of the layer structure in the pattern circumference, and precisely in the area separating two patterns.

In addition, it would be desirable to obtain patterns having a substantially identical relief.

Too high a fluctuation of the pattern level could indeed impair information reading.

Finally, it would be desirable to control and in particular to increase the relief, i.e. the pattern height, without altering the resolution of the printed array, whilst maintaining the printing stability over time.

An object of the invention is therefore to provide an improved locally printing method, in particular overcoming the above-mentioned problems.

The method according to the invention is a locally printing method for a stable structure in relief comprising a step of emitting appropriate polarisation light waves on a material layer comprising a photosensitive compound adapted to induce a topographic modification of said layer under the effect of said light waves, and is characterized in that said appropriate polarisation light waves are emitted on said layer through an aperture with a maximum size lower than or equal to 100 nm, circumferentially bound by an opaque area preventing the light waves from being propagated outside said aperture, said layer having a surface located at a distance lower than or equal to 100 nm from said aperture.

The above-mentioned opaque area restricts light leakage. It makes it possible to bound a truly localised aperture for the light emission and to control the size thereof. The electromagnetic field is thereby restricted to the vicinity of the surface to be printed and the size of the printed pattern and the resolution of an array comprising such patterns are perfectly controlled.

Because of the size of the above-mentioned aperture and the positioning thereof with respect to the photosensitive material layer, the method allows to print the structure through a near field light radiation.

As is known, it is meant under near field light radiation, an irradiation by the electromagnetic field components having their amplitude that exponentially decreases with the distance to the field generating light source.

It is further altogether surprising to observe that the thus locally bound aperture makes it possible to keep the polarisation of the light being emitted through said aperture.

Preferably, said aperture has a size lower than or equal to 60 nm, and more preferably, a size ranging from 40 to 60 nm.

According to a preferred embodiment of the invention, said appropriate polarisation light waves emitted through said aperture are transmitted by an optical fibre comprising an end portion having the general shape of a tip at the end of which said aperture is located.

More precisely, the tip end has the form of a truncated cone, bound by a globally planar side and a circumferential side and the aperture forms the globally planar side of the truncated cone, whilst the opaque area is the cone circumferential surface.

Preferably, the end portion of the optical fibre has the property of maintaining the polarisation features of the propagating light waves.

To this end, the end portion of the optical fibre has been obtained through heat sequential stretching.

The remainder of the disclosure refers to the accompanying drawings.

FIGS. 1 to 6 illustrate optical fibre ends observed with a scanning electron microscope (MEB) at various steps of the method according to the invention.

FIG. 7 schematically illustrates the device being used for implementing the printing method according to the invention.

Figure 1:
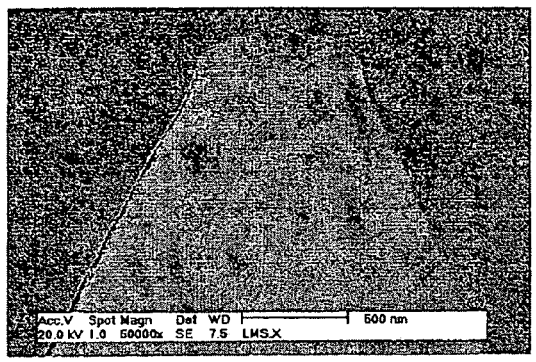

Preparing optical fibres useful for implementing the method will be now described in further detail.

The general principle of thinning an optical fibre through heat stretching is derived from that developed for biology micropipettes. It consists in locally heating, through infrared radiation absorption of a $CO_2$ laser, an optical fibre kept in tension. Above a determined temperature, the heated area of the fibre stretches and gets thinner. This leads, in some conditions, to the fibre breaking and a tip being formed.

The heat sequential stretching allows for the tip morphology to be controlled in situ upon the formation thereof. To this end, the heat stretching of the fibre occurs in a sequence of heating-cooling steps which are controlled by measuring the stretching and the thinning of the fibre.

The sequential stretching consists in heating the optical fibre by a plurality (typically about one hundred) of laser pulses of a varying duration, controlled by an electronic system. The pulse number n, of a $\tau_n$ duration, produces a $\Delta l_n$ stretching. Between two pulses, a delay is provided so as to allow the fibre to cool down. The process comprises four stages:

- stage 1 comprises defining the initial stretching conditions,
- stage 2 achieves some thinning of the fibre through constant steps and imparts a conical morphology to the tip,
- stage 3 accurately prepares the fibre diameter for forming the tip, and
- stage 4 only comprises a single laser pulse with a duration such that it achieves breaking the fibre and forming the tip.

During stage 1, the laser pulse duration is incremented by $\Delta \tau_I$ as long as the stretching generated by a pulse does not exceed a given threshold $\Delta l_I$. When, after the pulse number i, a stretching $\Delta l_i$ higher than threshold $\Delta l_I$ is measured, stage 1 is completed and the initial conditions of the stretching are defined. Duration $\tau_i$ of such a pulse is selected as a reference time $\tau_{ref}$ to define the time scale in the whole process; this is the required pulse duration for stretching by length $\Delta l_I$ the fibre of a typical initial diameter $D_1 = 125$ μm. The stretching threshold is an adjustable parameter the selected typical value of which is $\Delta l_I = 3$ μm. In the hereinabove described operating conditions, for a $CO_2$ laser with a power equal to 14 W, delivering a 2 mm diameter beam, and for the $\Delta l_I$ indicated value (+3 μm), the value of the reference pulse duration is typically $\tau_{ref} = 50$ ms. The value of the increment $\Delta \tau_I$ of the pulse duration is selected so as to be small relative to the value of $\tau_{ref}$; $\Delta \tau_I = 1$ ms.

Stage 2 corresponds to a thinning procedure during which the stretching produced by each pulse is required to be constant. The first parameter being defined is the set value, i.e. the stretching value $\Delta l_C$ which is required to be obtained. It is then required, for the pulse number n, to select the value of $\tau_n$, which will produce the stretching $\Delta l_n = \Delta l_C$. It is obvious that, as the fibre gets thinner, the pulse duration required for obtaining a fixed value of the stretching decreases. Thus, $\tau_n$ will necessarily be lower than $\tau_{n-1}$.

The decrease of the pulse duration is iteratively controlled. For determining the duration of the nth laser pulse, first the duration $\tau_n^0$ is defined having the deviation to $\tau_{n-1}$ identical to that between $\tau_{n-1}$ and $\tau_{n-2}$:

$$\tau_{n-2} - \tau_{n-1} = \tau_{n-1} - \tau_n^0 \quad (1)$$

Thereafter, the effective duration $\tau_n$ of the nth pulse is determined by adding to $\tau_n^0$ a correction taking into account, on the one hand, the deviation to the set value as measured during the pulse n−1 as well as, on the other hand, the slope with which the stretching (or the deviation to the set value) varies between pulses n−2 and n−1:

$$\tau_n = \tau_n^0 + C_r \delta v_n = \tau_n^0 + C_r[(\Delta l_C - \Delta l_{n-1}) - (\Delta l_{n-1} - \Delta l_{n-2})]/\Delta l_C \quad (2)$$

Such correction, the value of which depends on the measurement of the effect generated by the previous pulses, is one that gives to the method a feedback character. The correction value depends on the coefficient $C_r$. Such a coefficient plays the part of a feedback gain applied to the error signal $\delta v_n$.

Its value is selected so as to keep the error signal as low as possible, i.e. to keep $\Delta l_n$ as close as possible to $\Delta l_C$. The set value $\Delta l_C$ and the feedback coefficient $C_r$ are also adjustable parameters. In the above-described operating conditions, their respective values are typically $\Delta l_C = 3$ μm and $C_r = 1.3$ ms. Stage 2 is completed when the value of the pulse duration calculated according to equation 2 becomes lower than $\alpha \tau_{ref}$.

Coefficient $\alpha$ is an adjustable parameter a typical value of which is 0.45. At that time, the fibre thinning has made it possible to reach a diameter $D_2$ per pitch $\delta D_2$ (the typical values of $D_2$ and $\delta D_2$ in the above described operating conditions are respectively 20 μm and −1.5 μm). It is then required to continue the method with finer pitches so as to prepare with the utmost accuracy the fibre diameter which will allow for the tip end to be formed with the desired geometrical features.

Stage 3 is then defined during which the pulse duration decreases stepwise. During that stage, this is not only the measurement of the fibre stretching which is used for determining the value of the steps, but also the diameter $D_3$ as measured in situ through a microscope. As long as the fibre thinning (i.e. the variation $\delta D_n$ of the fibre diameter) is lower than the threshold $\delta D_3 = 0.5$ μm and the stretching $\delta l_n$ of the fibre is lower than threshold $\delta l_s = 1$ μm, the procedure is continued without changing the pulse duration. It should be noted that the choice of the threshold value $\delta D_3 = 0.5$ μm is directly related to the final resolution of the microscope being used for measuring the fibre diameter. With a view to the instrumental constraints, such a resolution is hard to improve and could in no way be much lower than 0.5 μm. The stretching threshold value (1 μm) is arbitrarily determined as being a typical value corresponding to the threshold thinning. Passing from one step to another one therefore occurs when one of the measured values, the thinning or the stretching of the fibre, exceeds the threshold value. When the fibre reaches a diameter $D_3$, stage 3 comes to an end. $D_3$ is an adjustable parameter. In the above described operating conditions, its typical value is $D_3 = 15$ μm.

The feedback principle changes again for stage 4. The duration of the last pulse is not fixed as a function of the result of the previous pulses. The stretching speed $V_e$ of the fibre is permanently measured. As long as the laser is not heating the fibre, $V_e$ is null. The electronic control of the laser supply triggers the pulse which is only interrupted when $V_e$ exceeds an established threshold $V_{es}$. The stretching speed threshold is an adjustable parameter the selected typical value of which, according to the above described operating conditions, for forming the desired tips, is $V_{es} = 0.002$ m.s$^{-1}$. The resulting tip further to this last pulse, visualised by MEB in FIG. 1 and 50,000× enlarged, has the shape of a truncated cone the end of which has a diameter $D_4$ ranging from 0.5 μm and 1 μm. The corresponding values of the <<apex>> angle θ range between 40° and 60°.

Figure 2:
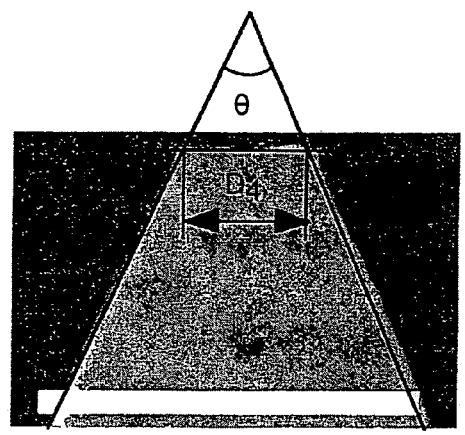

D4 and θ are illustrated in FIG. 2, where the fibre is identical as that in FIG. 1.

The accurate values for the fibre in FIGS. 1 and 2 are θ=48° and D4=700 nm.

Through such a thinning procedure, the fibre is divided into two identical tips. One of those two twin tips is used as a control tip, the other will be used for producing the optical fibre according to the invention or nanoprobe.

After the heat sequential stretching, the end portion of the optical fibre is subjected to an isotropic chemical etching, preferably with an acid, more particularly hydrofluoric acid.

The chemical etching step may be considered as the last step of the feedback process: the advancing state of the method is measured and, depending on the result of such a measurement, the chemical processing which the tip is subjected to is adjusted. This last step has the feature of not modifying the general shape of the tip, but it makes it possible to accurately adjust the size of its end. At the stretching completion, the size and the shape of the preformed tip, which characterise the advancing state of the method, are measured on MEB photographs of the control tip.

The complementary chemical etching of a preformed tip through heat sequential thinning is based on three principles:
- the chemical etching is isotropic and thus keeps the truncated cone shape of the tip: the diameter of the higher side of the truncated cone (the diameter of the probe aperture) may be decreased from the value D4 to the selected value D without the angle at the tip apex, $\theta$, being changed;
- the chemical etching speed may be adjusted independently from the other parameters of the method by selecting the concentration of the hydrofluoric acid solution;
- the chemical etching duration required for obtaining the desired final diameter only depends on the chemical etching speed and on the values of D4 and $\theta$ (measured on the control tip).

If e is defined as being the thickness to be dissolved and the linear etching speed or etching speed in the direction normal to the surface as V=de/dt, the etching time t required for obtaining the final value D for the aperture is $[\cos(\theta/2)(D4-D)]/2V[1-\sin(\theta/2)]$.

Figure 3:
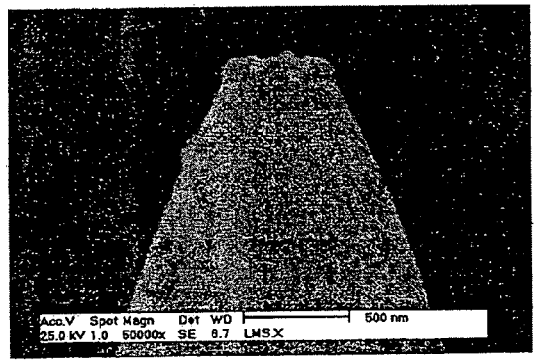
Figure 4:
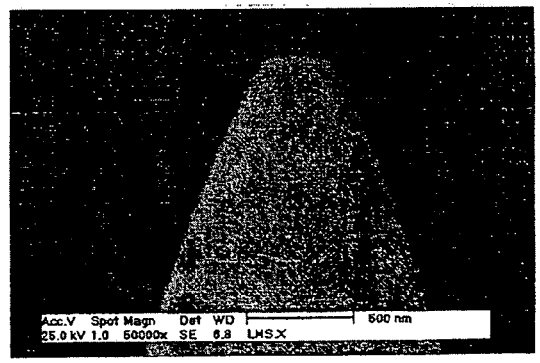

FIG. 3 shows the end of a tip observed through MEB (50,000× enlargement) before chemical etching and FIG. 4 shows the same tip after an etching in HF 12% at 25° C.

It can be seen that the chemical etching is isotropic and keeps the truncated cone shape of the preformed tips. Moreover, the complementary etching does not measurably affect, at such a scale, the surface roughness. It even seems that some uneven features will be <<rubbed out>>.

In the following step, the circumferential surface of the cone is made opaque.

Such a step is preferably performed through coating at least one metallic layer.

Any coating techniques are possible as long as the coating technique does not affect the geometry of the preformed tip end.

Preferably, the coating occurs under vacuum.

The nature of the metals to be used as well as the coated corresponding thickness are variable and should be such that there will be no passage left for light, and that any light leakage outside the aperture arranged in the globally planar side of the truncated cone will be prevented.

Generally, the total thickness of the metallic layer(s) ranges from 50 to 200 nm.

Preferably, a first chromium based layer is coated followed by an aluminium based layer.

In such a case, the chromium based layer has a thickness ranging from 2 to 20 nm and the aluminium based layer has a thickness ranging from 50 to 180 nm.

Typically, the evaporation occurs under a secondary vacuum from metallic filaments heated through Joule effect.

Within the evaporation enclosure, the end of the tip is provided at an adapted distance, for example 20 cm, above the metallic filaments.

In order that the higher side of the truncated cone formed by the end of the tip does not receive any metal, i.e. in order that the aperture of the probe be maintained, the tip is generally slightly upwardly tilted, for example by a 15° angle relative to the horizontal.

In order to obtain a homogeneous coating, the tip moves upon evaporation according to two rotation movements:
- a rotation movement around its axis;
- an azimuthal rotation movement around the vertical, i.e. according to the axis following the average direction of the evaporation flow.

The finally obtained optical fibre is an optical fibre useful as a near field probe comprising an end portion having the general shape of a tip the end of which having the shape of a truncated cone bound by an opaque circumferential surface and a globally planar side with a maximum dimension equal to 100 nm, defining an aperture allowing light waves to pass, said end portion maintaining the polarisation properties of propagating light waves.

Figure 5:
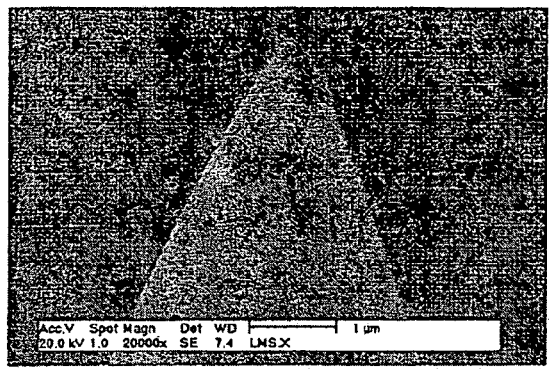
Figure 6:
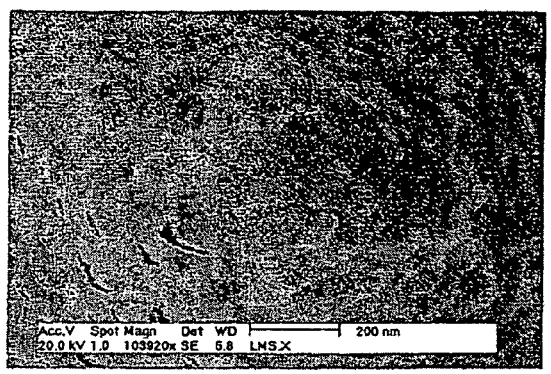

FIG. 5 shows a tilted view of such a fibre, being thinned, chemically etched and metallized as previously indicated, 20,000× enlarged and FIG. 6 shows a front view of the same fibre, 103,920× enlarged.

FIG. 5 shows that the metallization processing has not affected the global geometry of the end of the tip.

In FIG. 6, the probe aperture can be seen.

Its diameter is approximately 50 nm. The performed coating can be distinctly seen, in the aperture periphery, which has the form of small compact islands with an average size of 100 nm. An increase of the above-mentioned speeds of metallic evaporation makes it possible to obtain a more regular coating.

The resulting metallic layer prevents any light leakage outside the aperture.

Such a tip is ready to be used in the printing method according to the invention.

The stable structures in relief are printed in material layers comprising a photosensitive compound and generally having a thickness lower than 50 nm.

A preferred photosensitive compound is a compound subjected to an isomerization under the effect of appropriate light waves.

Preferably, such a photosensitive compound is a compound subjected to a cis/trans- or trans/cis-isomerisation under the effect of appropriate polarization light waves, in particular a photochromic compound comprising an azobenzene group.

The photosensitive compound is preferably linked by a covalent bond with the material of the layer in which the stable structure in relief is printed.

Preferably, the covalent bond occurs by means of a flexibilizing property chain and, more particularly, the flexibilizing property chain comprises at least one urethane group.

The particularly suitable material for the layer wherein the structure is printed comprises a polysiloxane matrix.

The polysiloxane matrix is preferably obtained through a sol/gel route from a hydrolysate composition of silane precursors.

The silane precursors are well known in the state of the art and comprise one or more hydrolysable functions such as Si—O-Alkyl, Si—Cl.

One suitable class comprises alkoxysilanes, in particular epoxyalkoxysilanes such as y-glycidoxypropyl trimethoxysilane, epoxycyclohexyl trimethoxysilane, as well as the following alkoxysilanes:

3-aminopropyltriethoxysilane, 3-aminopropyltrimethoxysilane, 3-aminopropylmethyldiethoxysilane, methyltrimethoxysilane, ethyltriethoxy-silane, vinyltriethoxysilane, phenyltriethoxysilane, dimethyldiethoxysilane, tetraethoxysilane.

The most suitable alkoxysilanes are tetraalkoxysilanes, and more particularly tetraethoxysilane (TEOS). Such alkoxysilanes play the part of tetrafunctional crosslinking agents and allow for the increase of the structure stiffness.

The photochromic molecules of the azobenzene family being little soluble in matrices of the sol/gel type, a molecule is preferably used with its azobenzene group which has been grafted onto an organic chain ending with a silicon alkoxide.

The polymerisable composition therefore preferably comprises one hydrolysate of at least one precursor represented by formula (I):

A-Z-B wherein

A represents an azobenzene group or a substituted derivate thereof,

Z is a divalent hydrocarbon chain interrupted by at least one urethane group,

B is a $—SiR_{(3-n)}(X)_n$ group, n varies from 2 to 3, wherein X represents a hydrolysable group such as

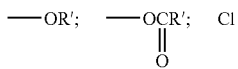

R and R' identical or different, represent an alkyl group having from 1 to 4 carbon atoms, and a hydrolysate of at least one precursor represented by formula $R_{(4-a)}Si(X)_a$ wherein a varies from 2 to 4 and X has the same meaning as hereinabove. Preferably, R' represents $C_2H_5$ and a=4 and n=3.

The preferred azobenzene precursor is represented by formula:

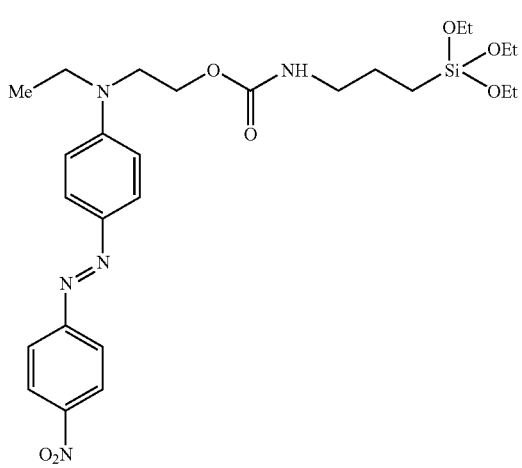

and will be referred to hereinafter as Si-DR1.

In order to inhibit the formation of aggregates and to give some freedom of movement to the photochromic compound, the composition may also comprise one hydrolysate of a precursor represented by formula (II):

A'-Z'-B' wherein:

A' is a cyclic hydrocarbon group optionally comprising an intracyclic heteroatom, Z' is a divalent hydrocarbon chain comprising at least one urethane group, B' is a group represented by formula $—SiR_{(3-n)}X_n$, wherein X, R and n have the same meaning as in formula (I) hereinabove.

The preferred precursor preventing the formation of aggregates is a trialkoxysilane comprising a carbazole unit:

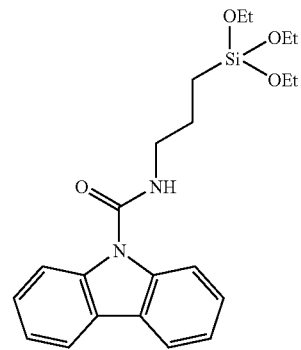

It will be hereinafter referred to as Si—K.

The hydrolysis method of the hydrolysable silanes is conventional and known to the man skilled in the art.

See, for example the following patents: FR 2,702,486, FR 2,704,581 or U.S. Pat. No. 4,211,823.

One could, for example, mix the starting silanes and perform the hydrolysis of the mixture.

Catalysts such as mineral or organic acids may be used.

It is additionally preferred to use, for the hydrolysis, an at least stoechiometric amount of water, i.e. a water molar amount corresponding to the number of function moles able to create silanol groups.

Organic cosolvents such as THF(tetrahydrofurane) may be used.

According to a suitable mode,

A. a complete hydrolysis is performed of a mixture of silicon alkoxides, previously put in solution in an organic solvent of the alkoxides, by an acid aqueous solution having a pH equal to 1;

B. in order to better control the sol evolution during the condensation step, and before shaping the samples, the sol acidity is decreased partially neutralising the acid required for the hydrolysis through the addition of a base;

C. the sol is then applied onto a substrate using a centrifugation technique.

The film can then be dried at room temperature or be subjected to a thermal processing, for example, through heating at a temperature ranging from 50 to 120° C., for 5 to 30 minutes.

At the end of the coating, a low thickness film is obtained ready to be used.

Printing a stable structure occurs by positioning, through an appropriate device, the aperture of a fibre tip obtained according to the previously described method, in the close vicinity of the layer surface comprising the photosensitive material, at a distance lower than 100 nm and preferably at a distance lower than 50 nm, and more preferably lower than 10 nm.

A light beam is then injected in the fibre tip and irradiation occurs for a time required for obtaining the local topographic modification.

The local topographic modification directly results from the irradiation step and does not require any additional development step, as can be seen from some prior art documents.

Typically, the irradiation general conditions are:

outlet power, at the level of the aperture at the tip end: 0.1 at lnW (nanowatt), the irradiation time varying from 1 to 30 seconds.

One of the advantages of the method according to the invention is that it makes it possible to achieve an accurate control of the height of the written plots as a function of the irradiation time and/or the power of the emitted light waves on the material layer comprising the photosensitive compound.

The invention also relates to a method for printing a stable pattern represented by plots in relief in a layer of material comprising a photosensitive compound able to induce a topographic modification of said layer under the effect of light waves emitted through at least one aperture such as previously defined, which is characterized in that:

a) a first plot is printed according to the hereinabove described method, b) a controlled lateral shift of said aperture is performed, c) another plot is printed operating as in step a) hereinabove, d) steps b) and c) are repeated so as to cover with plots a surface corresponding to said pattern.

Generally, the resulting plots have a height of at least 3 nm, preferably from 10 to 50 nm, and a lateral dimension substantially identical to the aperture size and two consecutive plots are spaced apart from less than 200 nm, preferably less than 100 nm, and more preferably less than 50 nm.

In order to more rapidly cover large surfaces, one may advantageously use a mask, comprising an opaque surface, generally parallel to the surface to be printed, and perforated with one or more apertures having the previously described features.

The invention provides numerous advantages.

In particular, in addition to those already mentioned, the invention allows to obtain plot arrays whose altitude variation, in the writing area, remains lower than their mean height, which could not be obtained in the prior art arrays.

The invention is applicable in the most various fields such as storing information on disks, fines markings, biotechnology, molecular electronics.

A particularly interesting application lies in the field of ophthalmic lenses.

It is indeed possible to achieve microstructure arrays, with a pitch lower than 200 nm, for producing anti-reflecting coatings.

Such a microstructure array could be printed directly on the surface of the ophthalmic glass, or on the surface of a mould part and transferred during the glass moulding.

Another possible application is printing distinctive marks such as a logo, invisible to the naked eye, and allowing to identify the glass origin.

Another possible application comprises producing discrete markings for tracking stored glasses or during their manufacturing process.

The following examples illustrate the present invention.

EXAMPLE 1

1) Manufacturing an Optical Fibre According to the Invention

An optical fibre is manufactured comprising an end portion having the general shape of a tip whose end have the form of a truncated cone from a monomode optical fibre sold by 3M and having the following features:

fibre diameter, including its protective plastic cover, 250 microns,
bare fibre diameter: 125 microns,
core diameter: 3.7 microns,
profile of the optical properties between core and sheath: index skip type,
cutoff wavelength: 460 nm.

Such a fibre is subjected to a heat sequential stretching according to the previously described general method using the following parameters:

stage I
  stretching threshold $\Delta l_I$=3 microns
  —$CO_2$ laser power: 14 watts
  diameter of the laser beam: approximately 2 mm
  value of the reference pulse duration $\tau_{ref}$: 50 ms
  valeur of the increment $\Delta\tau_I$=1 ms stage II
  $\Delta l_C$=3 microns
  Cr=1.3 ms
  $\alpha$=0.45 stage III
  D3=15 microns stage IV
  the stretching speed threshold is Ves=0.002 m.s$^{-1}$ The sequential stretching device that has been used is more particularly described in the hereinabove mentioned thesis by Philippe Bertrand dated $22^{nd}$ January 1999.

In short, the optical fibre is maintained through pinching between two rails, horizontally sliding on ball bearing.

The rail ends are connected to one another by a wire being guided by pulleys and to which is hanging a free weight, or any means allowing to ensure a fixed tension.

The device comprises a laser having its supply adjusted by a TTL control as well as a device allowing for the fibre elongation to be measured.

A microscope equipped with a camera allows for the fibre to be displayed during the stretching.

The features of the resulting fibre preformed tip after heat sequential stretching are as follows:

diameter of the aperture: 477 nm
cone angle: 46°

The tip is subsequently cleaned 3 minutes in a sulfochromic mixture placed in an ultrasonic vessel, then rinsed three minutes in distilled water (still in an ultrasonic vessel).

It is then subjected to a chemical etching with 12% mass HF hydrofluoric acid for a period of time of 2 min. 30 seconds. Then it is rinsed in distilled water and dried with isopropanol.

A metallization step is then performed comprising applying chromium and aluminium layers through evaporation under secondary vacuum from metallic filaments heated by Joule effect on the periphery of the fibre tip.

The first layer is a primer layer made of chromium of 10 nm thick coated on the whole tip circumference.

The chromium evaporates at a 0.23 nm/s speed.

Still through evaporation, a 100 nm thick aluminium layer is coated, at an evaporation speed of 1.82 nm/s.

The tip is kept on rotation whilst the layers are being coated:
azimuthal rotation speed: 1 rps
axial rotation speed: 5 rps
The ready to be used optical fibre is then obtained.
The size of the aperture of the fibre tip is approximately 55 nm.

2) Manufacturing Photosensitive Samples

The sample is a thin layer coated on a glass substrate. The layer is obtained through sol/gel route.

2.1—Sol Preparation

The starting reagents are as follows:
0.207 g of Si-DR1, i.e. $3.68 \times 10^{-4}$ mol;
0.307 g of Si—K, i.e. $7.37 \times 10^{-4}$ mol;
1.2 cm$^3$ of THF, or tetrahydrofurane, an organic solvent of the alkoxides being used;
0.041 cm$^3$ of TEOS, i.e. $1.84 \times 10^{-4}$ mol;
0.093 cm$^3$, i.e. $5.15 \times 10^{-3}$ mol, of an aqueous solution having a pH=1, adjusted through addition of hydrochloric acid.

The Si-DR1 compound and then the Si—K compound, both under the form of a powder, are weighed in a pill machine.

Then, the solvent (THF) is added in the open air, and the solution is homogenized through magnetic stirring.

Then, the TEOS as well as the acidified water are added, and the mixture is put again under magnetic stirring away from light for two hours.

At the hydrolysis completion, the medium is neutralised adding 0.0987 cm$^3$ of pyridine i.e. $1.22 \times 10^{-3}$ mol.

In order to reduce the viscosity of the sol being formed, 0.5 cm$^3$ of solvent (THF) are incorporated.

The sol is then filtered (diameter of the filter pores: 0.45 μm), then a 2.5°/oo mass surfactant is added.

The sol is then ready to be applied (concentration of mother solution referred to as $C_o$).

2.2—Coating of the Layers

The coatings occur through centrifugation on glass substrates (preliminarily cleaned microscope plates), for a time of 20 s.

During the rotation movement, the condensation process progresses, the solvent evaporates, and there finally remains a thin layer having its thickness which depends on the rotation speed and the concentration of the sol being used. The thickness typically varies between 10 nm and about 1 μm; it is determined using a profilometer.

Adjusting the Layer Thickness

A coating of the mother solution with a rotation speed of 3000 rpm allows to obtain a sample approximately 1 μm thick.

In order to obtain layers with lower thicknesses, the mother solution should be diluted and the centrifugation speed should be increased.

The hereinafter table gives the correspondence between the dilution of the mother solution and the thickness of the resulting sample for a rotation speed fixed at 6000 rpm

| Composition | Obtention | Concentration | Thickness (application 20s, 6000 rpm) |
|---|---|---|---|
| A | Mother solution | $C_o$ | 850 nm |
| B | 0.3 cm$^3$ A<br>0.3 cm$^3$ THF | $C_o$<br>2 | 323 nm |
| C | 0.3 cm$^3$ B<br>0.3 cm$^3$ THF | $C_o$<br>4 | 137 nm |
| D | 0.3 cm$^3$ C<br>0.3 cm$^3$ THF | $C_o$<br>8 | 45 nm |
| E | 0.3 cm$^3$ D<br>0.3 cm$^3$ THF | $C_o$<br>16 | 22 nm |
| F | 0.3 cm$^3$ E<br>0.3 cm$^3$ THF | $C_o$<br>32 | 12 nm |
| G | 0.3 cm$^3$ B<br>0.3 cm$^3$ THF | $C_o$<br>64 | 5 nm |

The thickness measurements are made after placing the freshly coated sample ten minutes in an oven at 100° C. so as to complete the condensation process and to evaporate the residual solvent.

The sample corresponding to E is used for the remainder of the implementation of the method of the invention.

3)—Writing Stable Structures in Relief

Device to be Used

Figure 7:
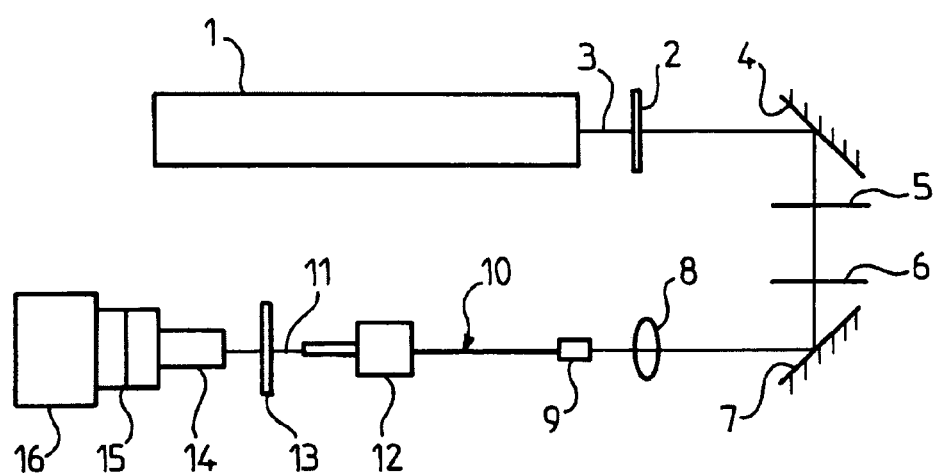

The device to be used is represented in FIG. 7.

An argon-krypton (1) laser is used with a wavelength of 568.2 nm (yellow ray of the krypton) generating a laser beam (3).

At the laser (1) outlet a 2 mm thick optical density (2) or neutral filter G4 is inserted. The laser beam (3) goes through the optical density (2) and is then reflected by a mirror (4), goes through a quarter wave plate (5) which converts the vertical rectilinear polarisation originating from the laser (1) into a circular polarisation, in turn sent to a polarizing filter (6). The filter (6) is typically a model HN22 Polaroïd polarizer.

At the polarizer (6) outlet, the beam impiges on a mirror (7) directing it towards a focus lens (8) (f'=10 mm).

The beam will then be injected into an optical fibre (10), prepared during the above described step 1 and having an end (11) with a thinned, circumferentially metallized tip.

At the lens outlet, the beam goes through a connector (9) corresponding to the non modified end of the optical fibre (10).

The optical fibre (10) goes through a microscope head (12) containing two (non shown) piezoelectric tubes allowing to ensure the shift, in the three space directions, of the end (11) of the tip of the thinned, circumferentially metallized optical fibre (10).

Such a piezoelectric system is disclosed in further detail in the above-mentioned thesis by Philippe Bertrand.

The light beam originating from the (non shown) aperture, at the end (11) of the tip of the fibre then goes through the sample (13) prepared during the above described step 2).

Then, the light beam is collected by a microscope objective (14) typically a Zeiss objective, <<Epiplan>> LD20x/0.40 and detected by a photomultiplier (16), typically a Hamamatsu R943 Ga—As 10 stages, equipped with a polarisation analyzer (15).

Writing an Array

The sample is placed as illustrated in FIG. 7, 5 nm away from the tip of the fibre (11).

A first scanning is preliminarily performed in order to check the cleanliness of the surface of the layer where the array will be written.

To this end, the aperture at the end of the tip is kept 5 nm away and a scanning is performed in a plane.

A 2 μm² surface designed for being printed is then controlled.

Subsequently, acting on the piezoelectric system, the tip is positioned above a determined location of the scanned surface (initial position).

Then the tip is moved in two perpendicular directions, x, y, in a plane parallel to the layer surface, and keeping the aperture 5 nm away from the layer surface.

A first plot line is printed by injecting, for two seconds for each plot, a light beam giving a tip outlet power at the aperture level of 170 pW.

Between each light pulse, the tip is moved along the axis x by a 116 nm distance.

After printing the first line, the tip is again arranged in its initial position and is moved along the 136 nm axis y, followed by printing a new plot line.

The operation is repeated until the array is obtained on the whole surface to be printed.

On the final array, the written plots are on average 5 nm high and 55 nm wide at half height.

Figure 8:
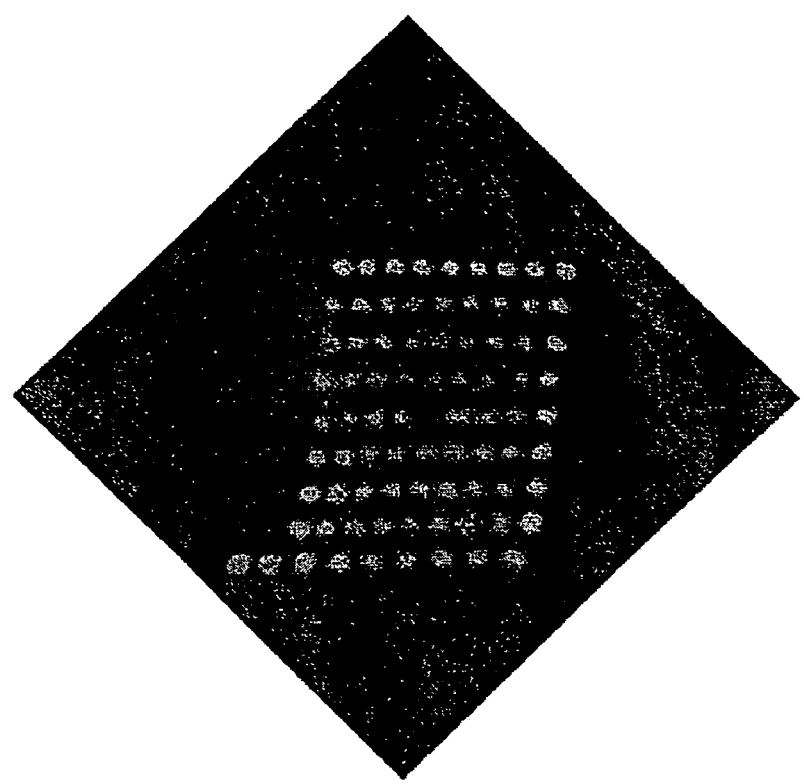
FIG. 8 illustrates a top view of an array obtained according to the invention.

The written array is illustrated on FIG. 8.

80 plots are written in a 1 μm² area, without servo light power and it can be observed that the altitude fluctuation is 4 nm for a 5 nm average height of the plots.

The central plot has been deliberately omitted so as to show that writing all the plots does not hinder the non enlightened central area.

EXAMPLE 2

A plot array is printed according to the method as described in example 1, with a 200 nm shift of the tip, along the axis x, between each printing operation, and increasing the radiation time (from 5 to 35 seconds for each 5 second pitch) for a fixed average power at the tip outlet.

Figure 9:
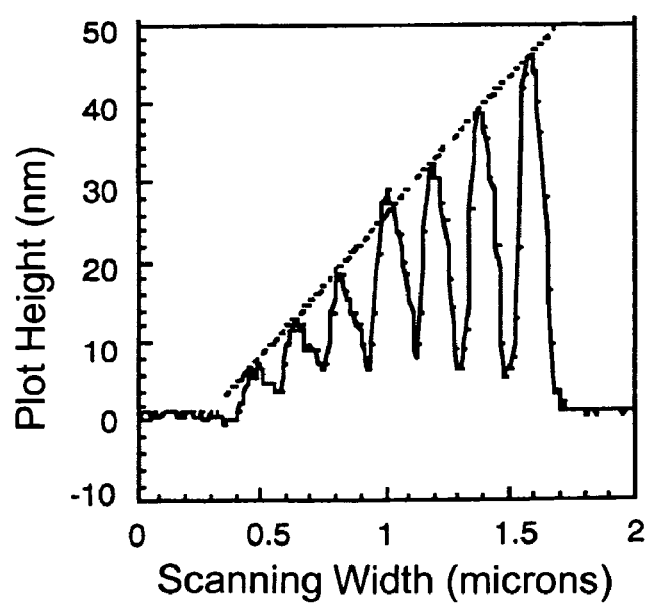
FIG. 9 illustrates a sectional view of a relief structure printed on the surface of a layer comprising a photosensitive material.

FIG. 9 illustrates a sectional view of the resulting array, along one of the lines of the plot array.

It can be observed that the plot height is directly proportional to the irradiation time.

The invention claimed is:

1. A method comprising emitting polarization light waves through an aperture with a dimension of maximum size lower than or equal to 100 nm, the aperture circumferentially bound by an opaque area that prevents the light waves from being propagated outside the aperture during use, wherein the emitted polarization light waves contact a material layer comprising a photosensitive compound whose surface is located at a distance lower than 100 nm from said aperture, and induce a topographic modification of the material layer thereby printing a stable structure in relief in the material layer without requiring any additional development step.

2. The method of claim 1, wherein the aperture has a dimension lower than or equal to 60 nm.

3. The method of claim 1, wherein the polarization light waves emitted through the aperture are transmitted by an optical fiber comprising an end portion having the general form of a tip at the end of which is arranged the aperture.

4. The method of claim 3, wherein the end of the tip has the form of a truncated cone bound by a globally planar side and a circumferential surface.

5. The method of claim 4, wherein the aperture is formed by the globally planar side of the truncated cone.

6. The method of claim 5, wherein the opaque area is formed by the circumferential surface of the cone.

7. The method of claim 6, wherein the circumferential surface comprises an opaque coating comprising at least one metallic layer.

8. The method of claim 7, wherein the opaque coating is a vacuum-deposited coating.

9. The method of claim 7, wherein the total thickness of the at least one metallic layer and any other metallic layer(s) is between 50 to 200 nm.

10. The method of claim 7, wherein the opaque coating comprises a chromium-based layer and an aluminum-based layer.

11. The method of claim 10, wherein the chromium-based layer has a thickness ranging from 2 to 20 nm and the aluminum-based layer has a thickness ranging from 50 to 180 nm.

12. The method of claim 3, wherein the end portion of the optical fiber maintains polarization properties of the propagating light waves during use.

13. The method of claim 12, wherein the end portion of the optical fiber is obtained through heat sequential stretching.

14. The method of claim 13, wherein, after heat sequential stretching, the end portion of the optical fiber is subjected to isotropic chemical etching.

15. The method of claim 1, wherein the layer comprising the photosensitive material has a thickness of less than 50 nm.

16. The method of claim 15, wherein the surface of the layer is arranged at a distance less than or equal to 50 nm from the aperture.

17. The method of claim 1, wherein the photosensitive compound undergoes cis/trans- or trans/cis-isomerization under the effect of the polarization light waves.

18. The method of claim 17, wherein the photosensitive compound and other material of the material layer are bonded via covalent bonds.

19. The method of claim 18, wherein the covalent bonds are formed by flexibilizing property chains.

20. The method of claim 19, wherein the flexibilizing property chains comprise at least one urethane group.

21. The method of claim 17, wherein the photosensitive compound comprises an azobenzene group.

22. The method of claim 1, wherein the material layer comprises a polysiloxane matrix.

23. The method of claim 22, further comprising obtaining a polysiloxane matrix prepared via a sol/gel process using a hydrolysate composition comprising silane precursors.

24. The method of claim 23, wherein the polysiloxane matrix is prepared through polymerization of a composition comprising a hydrolysate of at least one precursor of the formula:

A-Z-B wherein

A represents an azobenzene group or a substituted derivate thereof,

Z is a divalent hydrocarbon chain interrupted by at least one urethane group,

B is a —Si R(X)$_n$ group, n varies from 2 to 3, wherein X represents a hydrolysable group such as:

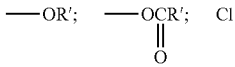

R and R', independently, represent an alkyl group having from 1 to 4 carbon atoms, and a hydrolysate of at least one precursor represented by formula $R_{(4-a)}Si(X)_a$, wherein a varies from 2 to 4 and X has the same meaning hereinabove.

25. The method of claim 24, wherein R' represents $C_2H_5$, a=4, and n=3.

26. The method of claim 23, wherein the composition comprises a hydrolysate of a precursor of formula:

A'-Z'-B' wherein:

A' is a cyclic hydrocarbon group;

Z' is a divalent hydrocarbon chain comprising at least one urethane group; and

B' is a group represented by formula —Si $R_{(3-n)}(X)_n$, n varies from 2 to 3, wherein X represents a hydrolysable group such as:

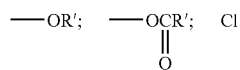

and R and R', independently, represent an alkyl group having from 1 to 4 carbon atoms, and a hydrolysate of at least one precursor represented by formula $R_{(4-a)}Si(X)_a$, wherein a varies from 2 to 4 and X has the same meaning hereinabove.

27. The method of claim 26, wherein A' is further defined as a cyclic hydrocarbon group comprising an intracyclic heteroatom.

28. The method of claim 1, further defined as a method of printing a stable pattern represented by plots in relief in the material layer, comprising:
(a) printing a first plot having a dimension;
(b) shifting laterally the aperture;
(c) printing another plot having a dimension;
(d) shifting laterally the aperture another time; and
(e) repeating the printing and shifting steps an appropriate number of times to print the pattern in the material layer.

29. The method of claim 28, wherein the dimension of each of the plots is substantially identical to the dimension of the aperture.

30. The method of claim 28, wherein the distance between two plots is lower than 200 nm.

31. The method of claim 30, wherein the distance between two plots is lower than 100 nm.

32. The method of claim 31, wherein the distance between two plots is lower than 50 nm.

33. The method of claim 28, wherein the plots have a height of at least 3 nm.

34. The method of claim 33, wherein the plots have a height ranging from 10 to 50 nm.

35. The method of claim 28, wherein the plot height is a function of irradiation time and/or intensity of the light waves emitted on the material.

36. The method of claim 1, wherein the light waves are emitted through an opaque mask comprising a plurality of apertures.

* * * * *

UNITED STATES PATENT AND TRADEMARK OFFICE
CERTIFICATE OF CORRECTION

PATENT NO. : 7,352,384 B2　　　　　　　　　　　　　　　　　　　　　　　Page 1 of 1
APPLICATION NO. : 10/485038
DATED : April 1, 2008
INVENTOR(S) : Nathalie Landraud et al.

It is certified that error appears in the above-identified patent and that said Letters Patent is hereby corrected as shown below:

In title page, item (54) and col. 1 title, line 3, please delete "fibre" and insert --fiber-- therefor.

In title page, item (75) Inventors, line 1, please delete "Lyons" and insert --Lyon-- therefor.

Signed and Sealed this

First Day of July, 2008

JON W. DUDAS
*Director of the United States Patent and Trademark Office*